(12) United States Patent
Elger et al.

(10) Patent No.: US 10,692,796 B2
(45) Date of Patent: Jun. 23, 2020

(54) SEMICONDUCTOR PACKAGE HAVING STACKED SUBSTRATES WITH CAVITIES

(71) Applicant: Technische Hochschule Ingolstadt, Ingolstadt (DE)

(72) Inventors: Gordon Elger, Ingolstadt (DE); Johannes Pforr, München (DE)

(73) Assignee: Technische Hochschule Ingolstadt, Ingolstadt (DE)

( * ) Notice: Subject to any disclaimer, the term of this patent is extended or adjusted under 35 U.S.C. 154(b) by 0 days.

(21) Appl. No.: 16/092,454

(22) PCT Filed: Apr. 24, 2017

(86) PCT No.: PCT/EP2017/059627
§ 371 (c)(1),
(2) Date: Oct. 10, 2018

(87) PCT Pub. No.: WO2017/186627
PCT Pub. Date: Nov. 2, 2017

(65) Prior Publication Data
US 2019/0164865 A1    May 30, 2019

(30) Foreign Application Priority Data
Apr. 25, 2016 (EP) .................................. 16166904

(51) Int. Cl.
*H01L 23/367* (2006.01)
*H01L 25/07* (2006.01)
(Continued)

(52) U.S. Cl.
CPC ........ *H01L 23/3675* (2013.01); *H01L 23/315* (2013.01); *H01L 23/3735* (2013.01);
(Continued)

(58) Field of Classification Search
None
See application file for complete search history.

(56) References Cited

U.S. PATENT DOCUMENTS

| 7,026,223 | B2 | 4/2006 | Goodrich et al. |
| 9,252,127 | B1 * | 2/2016 | Shen .................. H01L 25/0652 |

(Continued)

FOREIGN PATENT DOCUMENTS

DE    102014114982 A1    4/2016

OTHER PUBLICATIONS

Extended European Search Report; dated Nov. 8, 2016 for EP Application No. 16166904.9.
(Continued)

*Primary Examiner* — Lex H Malsawma
(74) *Attorney, Agent, or Firm* — Mendelsohn Dunleavy, P.C.; Steve Mendelsohn

(57) ABSTRACT

A semiconductor package (1, 1', 1"), the package (1, 1', 1") comprising a first substrate (2) comprising at a front cavity side (5') a plurality of cavities (6, 6'), each of the cavities (6, 6') having a bottom wall (7) and side walls (8), and having a conductive path (10) forming an electric contact surface (9) located at the inner side of the bottom wall (7) of the cavity (6, 6'), a plurality of semiconductor elements (16, 7), each of the semiconductor elements (16, 17) comprising a first electric contact surface (9) on a first side (26) and a second electric contact surface (9) on a second side (28) opposite to the first side (26), wherein at least one of the semiconductor elements (16, 17) is placed within a corresponding cavity (6, 6') at the front cavity side (5') of the first substrate (2), wherein the first electric contact (27) of the semiconductor element (16, 17) and the electric contact surface (9) at the inner side of the bottom wall (7) of the corresponding cavity (6, 6') are electrically conductive
(Continued)

bonded in a material-locking manner, and a second substrate (3), the second substrate (3) being attached with a connection side (12, 13) to the front cavity side (5') of the first substrate (2) thereby encapsulating the semiconductor elements (16, 17) located within the corresponding cavities (6, 6') at the front cavity side (5') of the first substrate (2).

24 Claims, 7 Drawing Sheets

(51) Int. Cl.
| | |
|---|---|
| *H01L 23/31* | (2006.01) |
| *H01L 23/373* | (2006.01) |
| *H01L 23/00* | (2006.01) |
| H01L 23/538 | (2006.01) |
| H01L 23/10 | (2006.01) |
| H01L 23/14 | (2006.01) |
| H01L 21/50 | (2006.01) |
| H02P 27/08 | (2006.01) |

(52) U.S. Cl.
CPC ............ *H01L 24/32* (2013.01); *H01L 25/071* (2013.01); *H01L 21/50* (2013.01); *H01L 23/10* (2013.01); *H01L 23/147* (2013.01); *H01L 23/5385* (2013.01); *H01L 23/5389* (2013.01); *H01L 2224/32157* (2013.01); *H01L 2224/8384* (2013.01); *H01L 2924/1203* (2013.01); *H01L 2924/1301* (2013.01); *H01L 2924/13033* (2013.01); *H01L 2924/13055* (2013.01); *H01L 2924/13091* (2013.01); *H01L 2924/14252* (2013.01); *H01L 2924/19051* (2013.01); *H01L 2924/19105* (2013.01); *H02P 27/08* (2013.01)

(56) References Cited

U.S. PATENT DOCUMENTS

| | | | |
|---|---|---|---|
| 9,355,997 B2* | 5/2016 | Katkar | H01L 21/561 |
| 9,478,504 B1* | 10/2016 | Shen | H01L 23/49838 |
| 9,536,862 B2* | 1/2017 | Shen | H01L 25/0652 |
| 2006/0198570 A1 | 9/2006 | Ogawa et al. | |
| 2007/0166958 A1 | 7/2007 | Wang | |
| 2012/0146177 A1 | 6/2012 | Choi et al. | |
| 2015/0262902 A1* | 9/2015 | Shen | H01L 23/315 |
| | | | 438/107 |
| 2015/0262972 A1* | 9/2015 | Katkar | H01L 21/561 |
| | | | 257/48 |
| 2017/0243813 A1* | 8/2017 | Wu | H01L 21/4853 |
| 2018/0040551 A1* | 2/2018 | Lin | H01L 23/13 |

OTHER PUBLICATIONS

International Search Report and Written Opinion; dated Jul. 28, 2017 for PCT Application No. PCT/EP2017/059627.

Hauffe, R., et al. "Optimized Micro-Via Technology for High Density and High Frequency (> 40GHz) Hermetic Through-Wafer Connections in Silicon Substrates." Electronic Components and Technology Conference, 2005. Proceedings. 55th. IEEE, 2005.

* cited by examiner

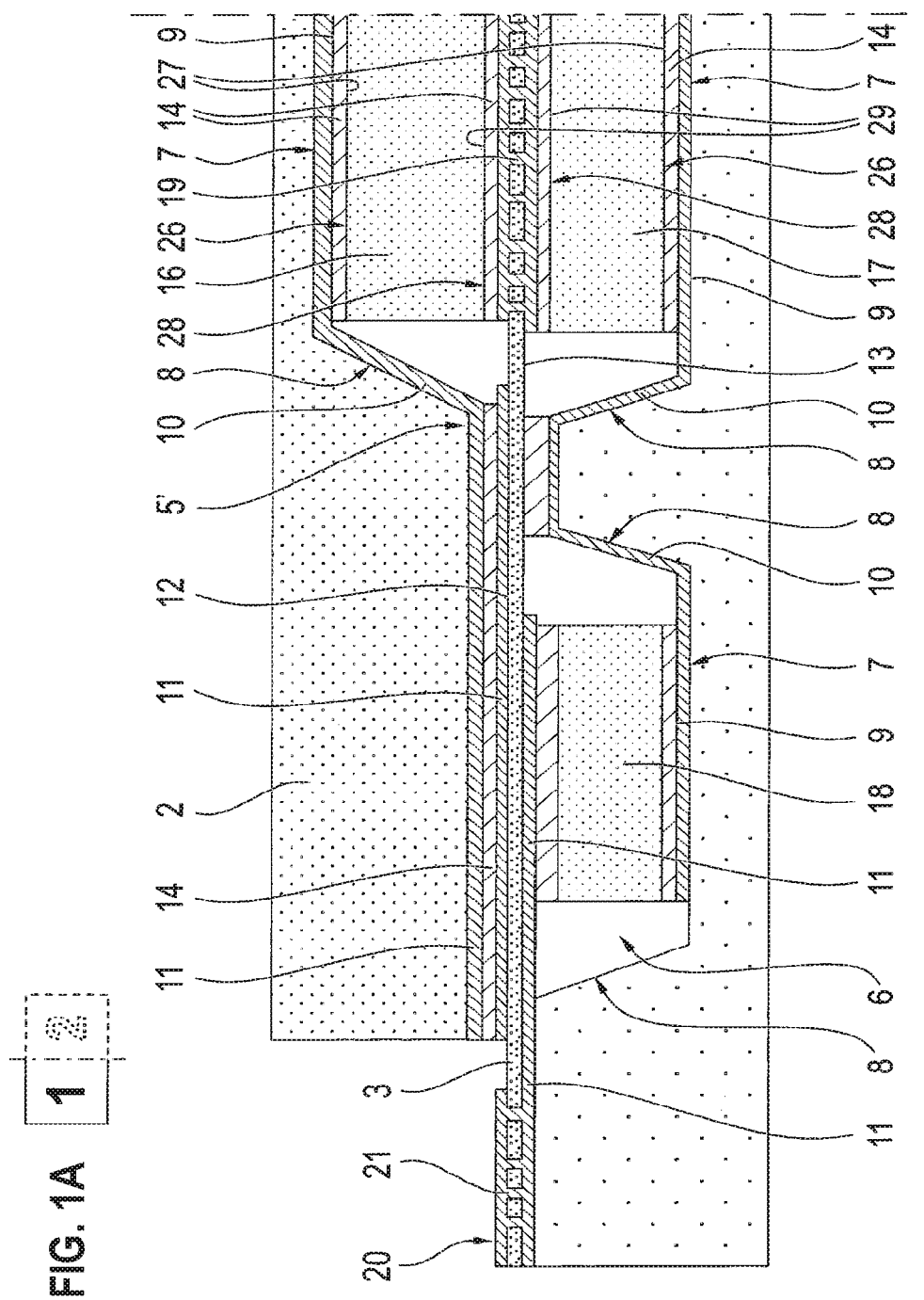

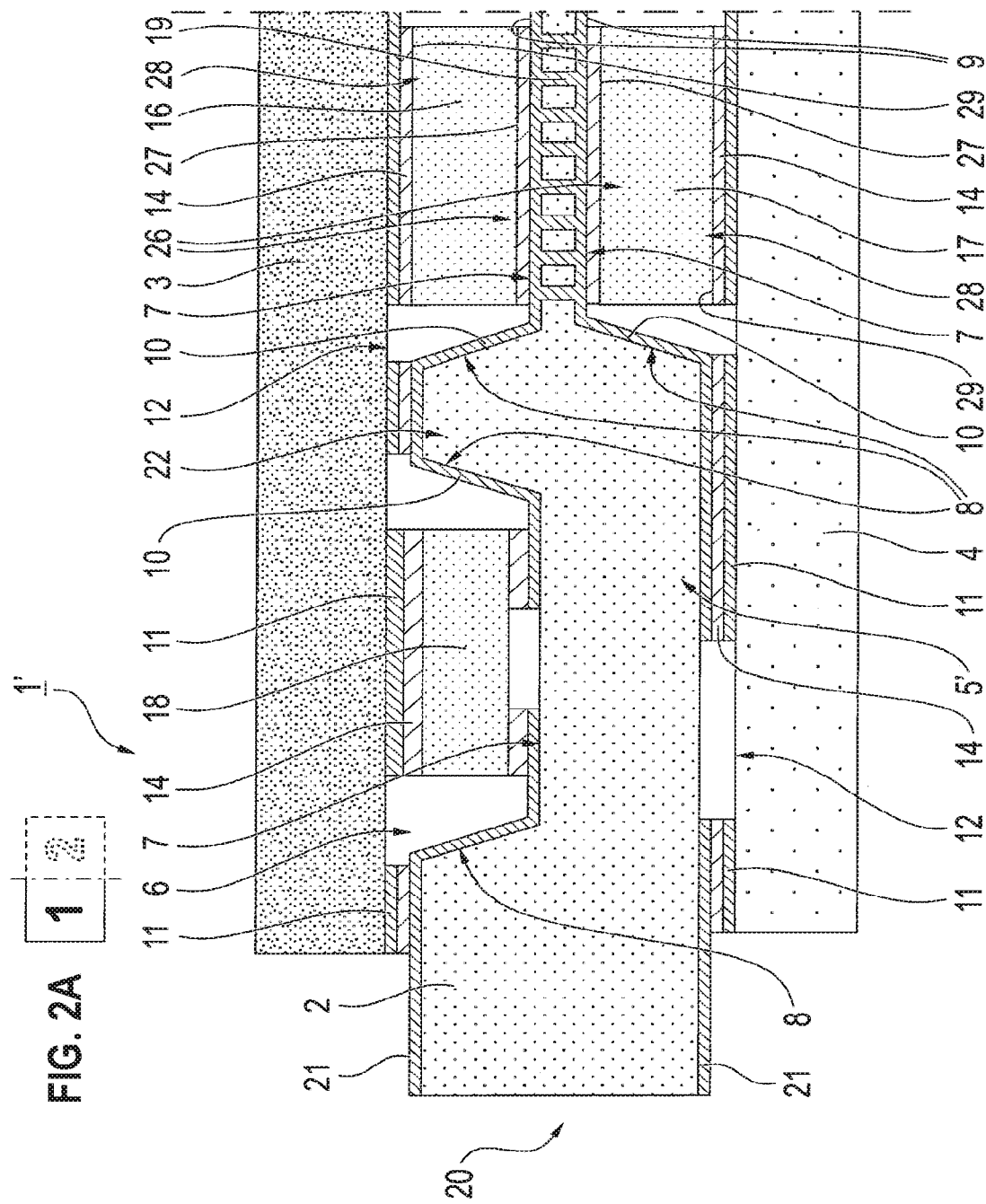

SEMICONDUCTOR PACKAGE HAVING STACKED SUBSTRATES WITH CAVITIES

BACKGROUND

Field of the Disclosure

The invention relates to a semiconductor package which comprises a first substrate and a second substrate, wherein between the first and the second substrate a plurality of cavities is formed, each of the cavities having a bottom wall and side walls, and a plurality of semiconductor elements, wherein at least one of the semiconductor elements is placed within a corresponding cavity and wherein the first and the second substrate are attached to each other thereby encapsulating the semiconductor elements located within the corresponding cavities. The invention is useful for any particular semiconductor element, where a hermetic encapsulation would be helpful and where heat dissipation during use is needed. Particularly, the semiconductor element is a semiconductor die, i.e. is a small block of semiconducting material, on which a given functional circuit is fabricated. The semiconductor element is, for example, one of a diode, a diac, a triac, a thyristor, a transistor, an IGBT and a MOSFET. The semiconductor element is particularly used as a switch or rectifier in power electronics. In particular, the invention relates to a power semiconductor element. More particularly, the invention relates to packed semiconductor elements for switching or rectifying currents and/or voltages for drives in electro mobility. Generally, the invention relates to the technical field of microelectronics, particularly to a stacked package of semiconductor elements.

Description of the Related Art

A semiconductor package of the aforementioned type is disclosed, for example, in U.S. Pat. No. 7,026,223 B2 and in US 2007/0166958 A1. In U.S. Pat. No. 7,026,223 B2 a package is disclosed that comprises a base and a lid, wherein a hermetically sealed cavity is formed therebetween and wherein a semiconductor element is placed within the cavity. The base includes conductive vias extending therethrough and the semiconductor element is electrically connected through the vias from the outer side of the base. Any further conductive paths through the junction between the base and the lid are avoided. The package shown in U.S. Pat. No. 7,026,223 B2 can be produced at a wafer level using conventional silicon wafer integrated circuit manufacturing machinery prior to separating the wafer into a plurality of devices. In US 2007/0166958 A1 a package is shown comprising a packaging wafer and an element wafer, wherein the packaging wafer comprises a plurality of cavities on an upper surface, wherein the element wafer comprises a plurality of semiconductor elements and wherein the packaging wafer and the element wafer are bonded to each other thereby enclosing the semiconductor elements. By a subsequent cutting process through trenches between the cavities a wafer level package is formed. The semiconductor elements are disposed and electrically connected at the element wafer.

In A. Hauffe, A. Kilian, M. Winter, L. Shiv, G. Elger et al.: "Optimized Micro-Via Technology for High Density and High Frequency (>40 GHz) Hermetic Through-Wafer Connections in Silicon Substrates", Electronic Components and Technology Conference 2005, Proceedings 55th, p. 324-330 (doi:10.1109/ectc.2005.1441286) it is known to attach a semiconductor element into a cavity of a cap. The cavity is wet etched from one side of the cap and leaves a thin membrane in the bottom of the cavity. The membrane is opened from the backside at the locations of micro-vias in an additional etching step. After structuring conductive metal paths the openings in the membrane are hermetically sealed by metal plating. At the inside of the cavity conductive paths are formed which run from the micro-vias along the side walls of the cavity to the front side of the cap. For hermetically sealing the cap is placed with its cavity onto the semiconductor element which is bonded to a circuit board adapted in size and form, and the cap is soldered to the circuit board by a sealing ring which surrounds the cavity. The encapsulated semiconductor element is electrically connected from the backside of the cap over the vias and over the conductive paths along the inner side walls of the cavity which are electrically connected with metallization lines of the circuit board to which the semiconductor element is bonded. No direct electrical contact is given at the backside of the semiconductor element.

Generally, the dominating electrical connection of semiconductor elements, e.g. "chips", is direct and wire bonding. Wire bonding causes additional inductance by the bond loops which cause parasitic effects like high voltage peaks when switching the element. High voltage peaks can cause failures during operation and a faster degradation thereby reducing the reliability of the device. Accordingly, a replacement of the wire bonds will increase the reliability. For a direct bonding solder or other bonding materials are deposited on the contact pads of the semiconductor element. For mounting the semiconductor element to a circuit board or substrate, it is flipped over so that its top side faces down and the solder bumps at the pads are aligned with matching pads on the circuit board. In a subsequent reflow process the pads of the semiconductor element and the pads of the circuit board then become soldered.

It is also known to stack semiconductor elements on top of each other, wherein, for example, a first semiconductor element is placed on a front side of a lead frame and wherein a second semiconductor element is placed at the back side of the same lead frame. Additional electronic components may be added to the lead frame. Separation of the conductive paths of the lead frame takes place during a subsequent fabrication step. However, in case of a vertical current flow through the semiconductor elements, wires have to be bonded at the back sides of the semiconductor elements, respectively. However, this will cause additional inductance and raises problems with regard to heat dissipation because a heat sink cannot be placed at the backsides of the semiconductor elements.

Humidity and corrosive atmosphere both cause degradation and failures of the semiconductor elements. This problem is solved, as already mentioned above, in a known manner by packages which encapsulate or hermetically seal a semiconductor element placed therein. Use of such packages will increase the lifetime of the semiconductor elements but will also cause additional costs. Usually, the encapsulated semiconductor element is electrically contacted with the aid of electrical vias through the package which are filled with metal. The fabrication of the vias has to be implemented as an additional production step and increases the costs on the whole.

SUMMARY

It is an object of the present invention to provide an aforementioned semiconductor package with an improved reliability which can be fabricated at low cost and which additionally allows improved heat dissipation.

According to the invention, this object is solved by providing a semiconductor package, the package comprising a first substrate comprising at a front cavity side a plurality of cavities, each of the cavities having a bottom wall and side walls, and having a conductive path forming an electric contact surface located at the inner side of the bottom wall of the cavity, a plurality of semiconductor elements, each of the semiconductor elements comprising a first electric contact surface on a first side and a second electric contact surface on a second side opposite to the first side, wherein at least one of the semiconductor elements is placed within a corresponding cavity at the cavity side of the first substrate, wherein the first electric contact of the semiconductor element and the electric contact surface at the inner side of the bottom wall of the corresponding cavity are electrically conductive bonded in a material-locking manner, and a second substrate, the second substrate being attached with a connection side to the front cavity side of the first substrate thereby encapsulating the semiconductor elements located within the corresponding cavities at the front cavity side of the first substrate.

Generally, the invention starts with the idea to provide a semiconductor package that is completely mountable on wafer level. Any conventional semiconductor wafer, e.g. a silicon wafer, and/or a conventional ceramic tile can be used as a substrate. The invention also allows for integrate a plurality of active and passive electric components within the encapsulated cavities. Moreover, as will be explained in detail below, the invention allows to stack semiconductor elements in cavities of different substrates and to electrically connect them directly, for example, through conductive vias extending through a substrate. The invention also provides a layer between the substrates for electrical connection of the elements or components placed within the cavities. The outer sides of the semiconductor package are electrically insulated from an inner side, which allows for excellent direct heat dissipation through the substrate by attaching a heat sink on at least one of the outer sides of the package. Preferably, the assembled package is separated into several packages by a subsequent cutting step.

The semiconductor elements and also other active or passive electric components can be added and bonded at the wafer level using conventional wafer integrated circuit manufacturing machinery. Any conventional die or flip-chip wafer level bonding process may be used. The semiconductor elements, additional electric components and the substrates are preferably bonded by a soldering or sintering process. An eutectic soldering process may be used. A transient liquid phase soldering is preferred due to its lower process temperature. Preferably, a silicon wafer is used as at least one of the substrates. According to a preferred embodiment the cavities are fabricated by a dry or wet etching process. Electrical conductive paths along the substrates can be fabricated by a lithographic process combined with metal deposition like electroless plating or electroplating, a CVD or a PVD process. Other processes like direct laser ablation, plasma deposition, dispensing, jetting or printing of conductive material might be also used. As already mentioned above, the process of attaching the semiconductor elements and further electric components within the cap and of attaching the substrates to each other is preferably performed on a wafer level.

Advantageously, the semiconductor package further comprises a third substrate that is attached with a connection side to the first substrate or to the second substrate, respectively.

With a third substrate at least two layers at the connection sides interconnecting two of the third substrates are provided for electrical connection of the semiconductor elements and other electric components, respectively.

According to an embodiment of the invention the second substrate comprises two opposed connection sides, wherein the third substrate further comprises on a cavity side which is the connection side a plurality of cavities, each of the cavities having a bottom wall and side walls, and having a conductive path forming an electric contact surface located at the inner side of the bottom wall of the cavity, wherein at least one of the plurality of semiconductor elements is placed within a corresponding cavity at the cavity side of the third substrate, wherein the first electric contact of the semiconductor element and the electric contact surface at the inner side of the bottom wall of the corresponding cavity are electrically conductive bonded in a material-locking manner, and wherein the third substrate is attached with the cavity side to a connection side of the second substrate thereby encapsulating the semiconductor elements located within the corresponding cavities at the cavity side of the third substrate.

In this first embodiment the second substrate is an intermediate substrate carrying the first and the second substrate on its both sides. According to a preferred embodiment the first substrate as well as the third substrate comprise cavities and are connected with its respective cavity sides at one of the connection sides of the second substrate, respectively. For conducting the semiconductor elements as well as other electric components disposed in the cavities of both substrates two structured conductive layers are provided at the connection sides of the second substrate. Preferably, the second substrate is a semiconductor wafer with a thickness that is smaller than the thickness of the first and the third substrate. Advantageously, the second substrate is a silicon wafer with a thickness between 20 and 100 µm. Conductive vias are fabricated by known methods, for example, by wet etching or dry etching, particularly reactive ion etching. In a subsequent step, metal is brought into the vias by PVC, CVD or by electroplating.

The first and the third substrate are particularly made from a semiconductor or from a ceramics. Preferably, a semiconductor wafer or a ceramic tile is used. Advantageously, the first and/or the third substrate are produced as a multi-layer ceramic tile, for example, by attaching the different ceramic layers with a sintering process. In case of a semiconductor wafer the cavities can be fabricated by already known methods like dry or wet etching, particularly ion etching.

According to another preferred embodiment of the invention the first substrate further comprises also on a back cavity side opposite to the front cavity side a plurality of cavities, each of the cavities having a bottom wall and side walls, and having a conductive path forming an electric contact surface located at the inner side of the bottom wall of the cavity, wherein at least one of the plurality of semiconductor elements is placed within a corresponding cavity at the back cavity side of the first substrate, wherein the first electric contact of the semiconductor element and the electric contact surface at the inner side of the bottom wall of the corresponding cavity are electrically conductive bonded in a material-locking manner, and wherein the third substrate is attached with the connection side to the back cavity side of the first substrate thereby encapsulating the semiconductor elements located within the corresponding cavities at the back cavity side of the first substrate.

This second embodiment of the invention provides for two flat, unstructured outer substrates, i.e. the second and the third substrate. Accordingly, commercially available low cost semiconductor wafer can be implemented. Alternatively, a flat ceramic substrate, for example a DBC ceramic is used as the second and/or the third substrate.

The first substrate in this second embodiment is a substrate that is structured with cavities on both sides. Preferably, between the cavities conductive vias are brought into the substrate by already known methods, as explained above. For generating the cavities a wet etching process is preferred that allows fabrication of cavities on both sides of the substrate in a common fabrication step. Preferably, a SOI wafer (silicon/silicon dioxide/silicon) is used as the first substrate. The intermediate glass layer functions as a stop during the etching process. Alternatively, a conventional semiconductor wafer can be used and the cavities are produced by a timely controlled etching process. Remaining differences in the thickness of the bottom walls of the cavities may be tolerated by the process to be used for bonding the semiconductor elements or other electric components at the bottom wall within the cavity. According to yet another alternative the first substrate is produced by bonding two structured semiconductor wafers to each other. Preferably, no silicon remains between the electric components placed in opposed cavities. Metallic traces are fabricated on the outer sides of both of the semiconductor wafers and subsequently, the semiconductor wafers are bonded to each other with its inner silicon sides. In a subsequent step, cavities through both wafers are fabricated by an etching process.

The first substrate according to another preferred alternative can be also made from a multi-layer ceramic tile. By a multi-layer composing process cavities as well as vias can be fabricated in an already known manner.

According to yet another preferred embodiment of the invention the second substrate further comprises on a cavity side a plurality of cavities, each of the cavities having a bottom wall and side walls, and having a conductive path forming an electric contact surface located at the inner side of the bottom wall of the cavity, wherein at least one of the plurality of semiconductor elements is placed within a corresponding cavity at the cavity side of the second substrate, wherein the first electric contact of the semiconductor element and the electric contact at the inner side of the bottom wall of the corresponding cavity are electrically conductive bonded in a material-locking manner, and wherein the third substrate is attached with the connection side to the cavity side of the second substrate thereby encapsulating the semiconductor elements located within the corresponding cavities at the cavity side of the first substrate.

This third embodiment of the invention uses two similar substrates, i.e. the first substrate and the second substrate, which are stacked one on top of the other. The intermediate second substrate covers the cavities within the first substrate. The third substrate covers the cavities of the second substrate. Such a package does have a lower symmetry in comparison to the first and second embodiment. However, the fabrication process causes lower costs. The first and the second substrates are similar and are made, preferably, from a semiconductor wafer or a ceramic tile as already explained above. Preferably, the cavities within the second substrate are fabricated without remaining substrate substance at the bottom wall. The bottom walls of these cavities of the second substrate are constituted by a remaining metallization or conductive area. The third substrate is, for example, a low cost flat wafer like an unstructured semiconductor wafer or is a flat ceramic tile.

According to a yet another preferred embodiment of the invention, the total hight of the cavity matches the total hight of the semiconductor element placed therein so that the second side of the semiconductor element is aligned with the cavity side. In other words, the second side of the semiconductor element is leveled with the edge of the substrate surrounding the cavity. However, depending on the used bonding process differences in hight between the cavity and the semiconductor element or another electric component placed within the cavity can be tolerated or balanced. Accordingly, for the bonding process transient liquid phase soldering and soft soldering are preferred methods allowing leveling of the surfaces of the components to be bonded.

The invention does also cover the embodiment that several semiconductor elements and/or electric components are placed within one single cavity.

Preferably, the semiconductor element comprises a first, a second and a third electric contact. Advantageously, the semiconductor element is placed with the side into the cavity that comprises one single electric contact. A machinery tool may be used for placing the semiconductor elements or other electric components into the cavity that comprises distance elements for leveling the surface of the semiconductor element and/or of the electric component with the edges of the substrate surrounding the cavity. A difference in hight between the cavity and the semiconductor element or the electronic component is leveled by the thickness of the solder or sintering material placed at the bottom wall within the cavity.

Advantageously, at least one portion of the conductive path of at least one of the cavities is attached to the inner side of at least one of the side walls of said at least one cavity. The conductive paths which are routed along the inner side of the cavity can be fabricated by a lithographic process combined with metal deposition, like electroless plating or electroplating, a CVD or PVD process. Other processes like direct laser ablation, plasma deposition, dispensing, jetting or printing of conductive material might be also used. The conductive path along the inner side of the cavity is used to electrically contact the first electric contact located at the first side of the semiconductor element at the bottom wall of the cavity. To avoid a signal reflection at the semiconductor and to increase the transfer of electrical power the conductive path is impedance matched by its electrical routing within the cavity. The direct connection of the first electrical contact at the first side of the semiconductor elements provides low parasitic impedance. The direct interconnection also increases the transfer of heat from the semiconductor element to the substrate. This additional increases the reliability of the device.

Preferably, at a cavity side of at least one of a substrate disjunct electrically conductive areas are comprised and wherein the conductive path of at least one of the cavities of said cavity sides extends between the corresponding electric surface located at the inner side of the bottom wall of said at least one cavity and at least one of the disjunct conductive areas at said cavity side. The disjunct electrically conductive areas provide for the electric connection of the elements and components placed within the cavities. Preferably, the second electric contact surface at the second side of at least one of the semiconductor elements and at least one of the conductive areas at the connection side of at least one substrate are electrically conductive bonded in a material-locking manner. This direct bonding allows for increasing the heat transfer from a semiconductor element to the substrate as already described above.

According to yet another preferred embodiment at least one of the disjunct electrically conductive areas at the cavity side of at least one of the substrates and at least one of the disjunct electrical conductive areas at the connection side of another substrate are electrically conductive bonded in a material-locking manner. Preferably, all substrates are connected in a common sintering or soldering process.

According to another preferred embodiment of the invention at least one of the substrates is extending with a contact region beyond another substrate, wherein the contact region comprises at least one electrically conductive region which is electrically conductive connected with at least one of the electrically conductive areas. This embodiment provides a freely accessible contact area for the electrical connection of the semiconductor elements and electric components within the package.

Advantageously, at least one first cavity with a first semiconductor element placed therein and at least one second cavity with a second semiconductor element placed therein are located on top of each other, wherein at least one electric contact of the first semiconductor element and at least one electric contact of the second semiconductor element are electrically conductive bonded to each other in a material-locking manner. This embodiment allows for direct stacking of semiconductor elements and other electric components. By a direct electrical contact between the stacked semiconductor elements and components additional inductance by bond loops of vias is avoided.

Preferably, the respective electric contacts of the first semiconductor element and of the second semiconductor element are bonded to each other through vias located in one of the substrates or through at least one of the disjunct electrically conductive areas.

According to yet another preferred embodiment of the invention the package further comprises a plurality of passive electric components, at least one of said passive electrical components being placed within a corresponding cavity.

BRIEF DESCRIPTION OF THE DRAWINGS

The advantages and purposes of the invention become more apparent from a study of the following figures which show different embodiments of the invention.

DETAILED DESCRIPTION

Figure 1B:
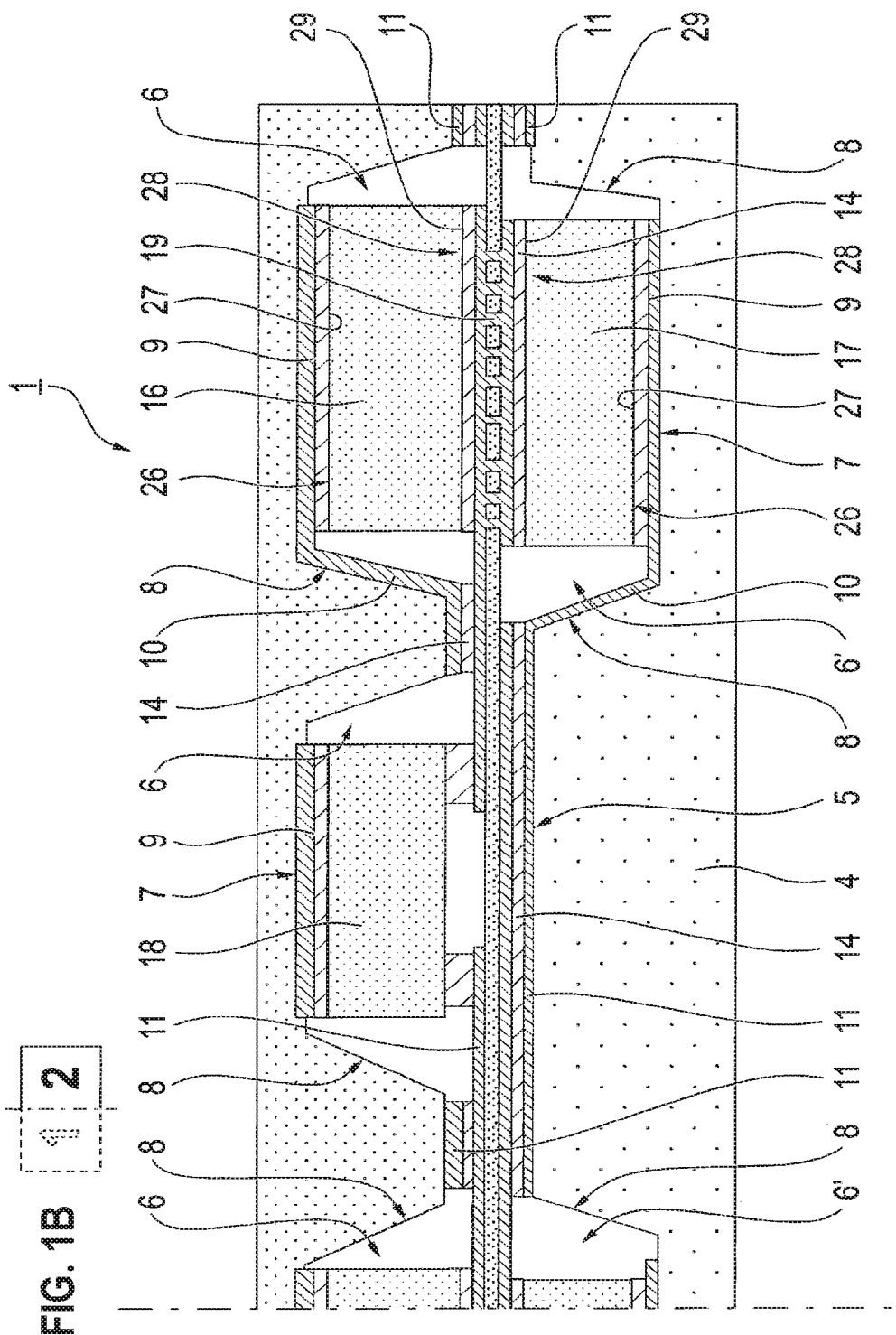
FIG. 1 shows a first embodiment of a semiconductor package with an intermediate substrate between two structured outer substrates.

FIG. 1 shows a first embodiment of a semiconductor package 1 wherein a first substrate 2 is placed above an intermediate second substrate 3 to which on an upper side a third substrate 4 is attached.

The first substrate 2 and the third substrate 4 both comprise at its inner sides, which are further referred to also as cavity sides 5, a plurality of cavities 6, 6' each of which comprises a bottom wall 7 and side walls 8. Preferably, a semiconductor wafer is used as the first substrate 2 and/or as the third substrate 4 and the cavities 6, 6' are fabricated by dry etching. Alternatively, the first substrate 2 and/or the third substrate 4 may be fabricated as a multi-layer ceramic tile.

At the bottom wall 7 of the cavities 6, 6' electric contact surfaces 9 are provided which are connected to a conductive path 10 which is attached to the inner side of a side wall 8 of the respective cavity 6, 6'. The conductive paths 10 extending along the inner side of the cavities 6, 6' and are electrically connected to at least one of disjunct electrical conductive areas 11 which are attached at the cavity sides 5 of the first substrate 2 and the third substrate 4.

The second substrate 3 has a thickness that is smaller than the thickness of the first substrate 2 and the third substrate 4. Preferably, a thin flat semiconductor wafer is used as the second substrate 3. The second substrate 3 on both sides comprises also disjunct electrical conductive areas 11 which are attached to the surface of the substrate 3 in an already known manner. Each side of the second substrate 3 provides a connection side 12, 13, respectively. In the assembled semiconductor package 1 the disjunct electrical conductive areas 11 at the first connection side 12 and at the second connection side 13 of the second substrate 3 are bonded to the respective disjunct electrical conductive areas 11 at the cavity sides 5 of the first substrate 2 and of the third substrate 4.

The bonding process is, for example, a soldering process, wherein a solder 14 is placed between the respective conductive areas 11 at the locations to become bonded.

Within the cavities 6, 6' first semiconductor elements 16 and second semiconductor elements 17 and passive electric components 18 are located. The semiconductor elements 16, 17 and the passive electric components 18 placed within the cavities 6, 6' are bonded with its respective electric contacts with the electric contact surface 9 at the bottom wall 7 of the respective cavities 6, 6'. For the semiconductor elements 16, 17 its respective first side 26 and its respective first electric contact 27 are shown. Any useful bonding process described above can be used to fix the components and elements within the cavity 6, 6'. On its respective second side 28 the semiconductor elements 16, 17 and the passive electric components 18 are bonded with its respective electric contacts 29 to at least one of the disjunct electrical conductive areas 11 at the connection sides 12, 13 of the second substrate 3.

The second substrate 3 and the third substrate 4 both extend with a contact region 20 beyond the first substrate 2. The contact region 20 comprises a freely accessible conductive region 21 which is connected with at least one of the electrical conductive areas 11 within the package 1.

The second substrate 3 additionally comprises electrically conductive vias 19 which are provided between the stacked semiconductor elements 6, 6'. This allows a direct stacking of the semiconductor elements 6, 6' where its respective electrical contacts are directly connected. Additional inductance induced by wire bonding is avoided. The vias are fabricated by known fabricating processes as already described above.

The first substrate 2 extends with a contact region 20 beyond the second substrate 3 and the third substrate 4. On the contact region 20 of the first substrate 2 a freely accessible conductive region 21 is provided.

Figure 2B:
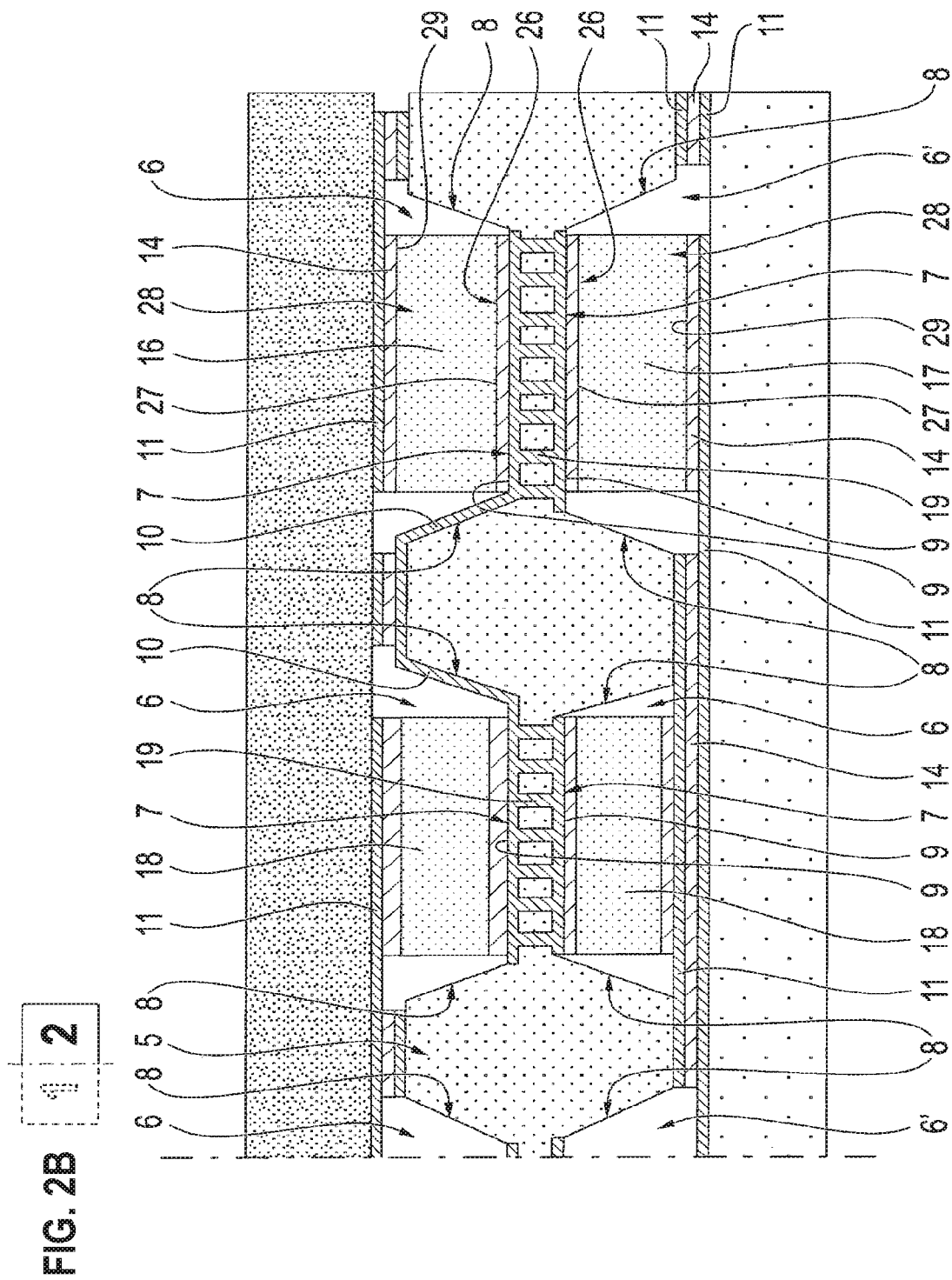
FIG. 2 shows a second embodiment of a semiconductor package with an intermediate structured substrate placed within two flat outer substrates.

FIG. 2 depicts a second embodiment of a semiconductor package 1'. The semiconductor package 1' according to FIG. 2 differs from the semiconductor package 1 shown in FIG. 1 in that the first substrate 2 which comprises the cavities 6, 6' is an intermediate substrate which comprises at its both sides, i.e. a front cavity side 5 and a back cavity side 22, cavities 6, 6'. Preferably, the intermediate first substrate 2 of the semiconductor package 1' is a semiconductor wafer. Alternatively, a multi-layer ceramic tile is used. Between some of the cavities 6, 6' conductive vias 19 are comprised which allow a direct electrical connection of the respective contacts 27, 29 of the semiconductor elements 16, 17 and the electric components 18 through the first substrate 2. The second substrate 3 and the third substrate 4 are flat outer substrates which do not comprise any cavity. A conventional thin unstructured semiconductor wafer is preferably used as the second substrate 3 and the third substrate 4.

Figure 3A:
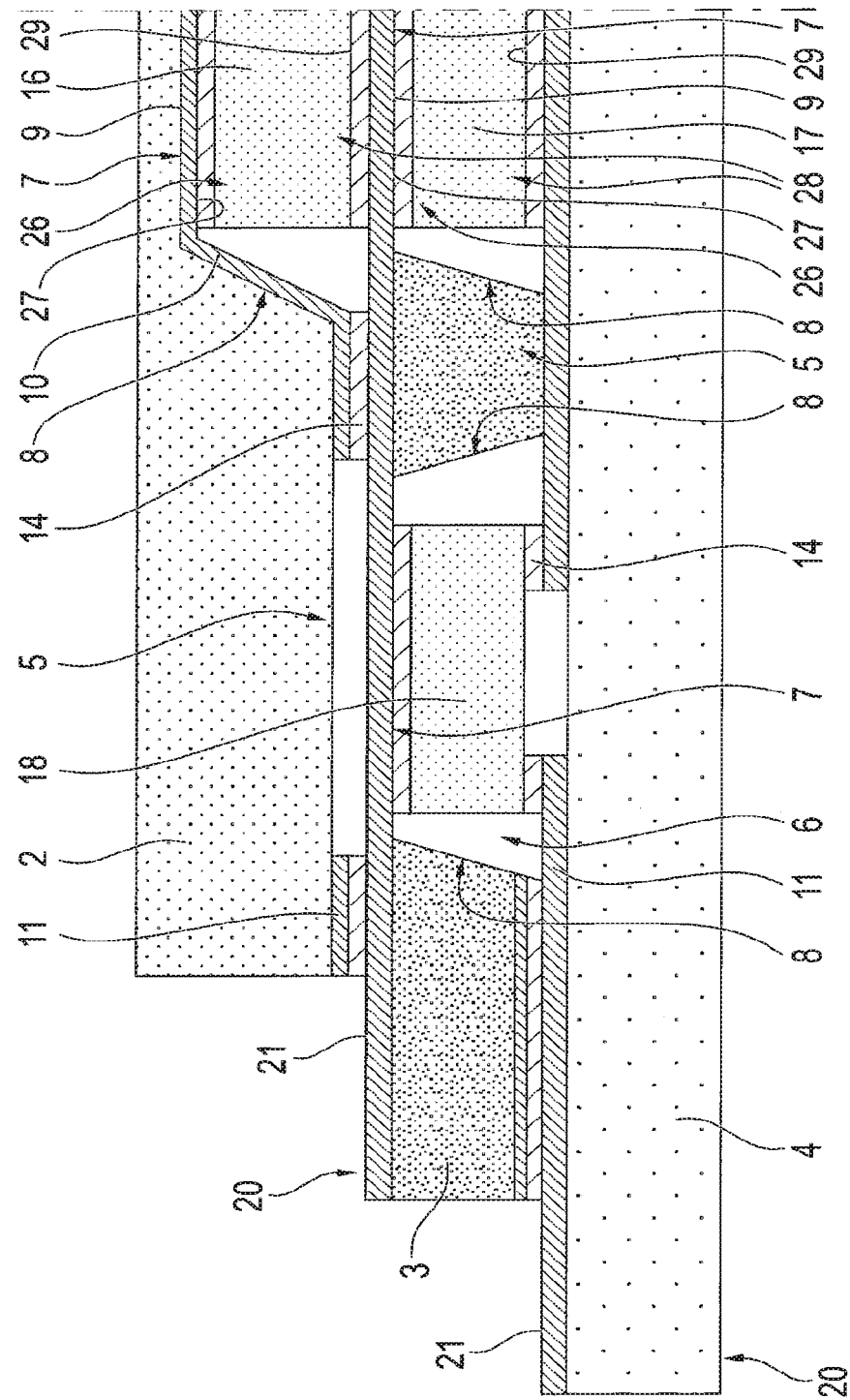
FIG. 3 shows a third embodiment of a semiconductor package with two stacked structured substrates covered by a flat third substrate and FIG. 4 shows an electronic circuitry comprising electric elements that can be placed in a semiconductor package according to the invention.
Figure 3B:
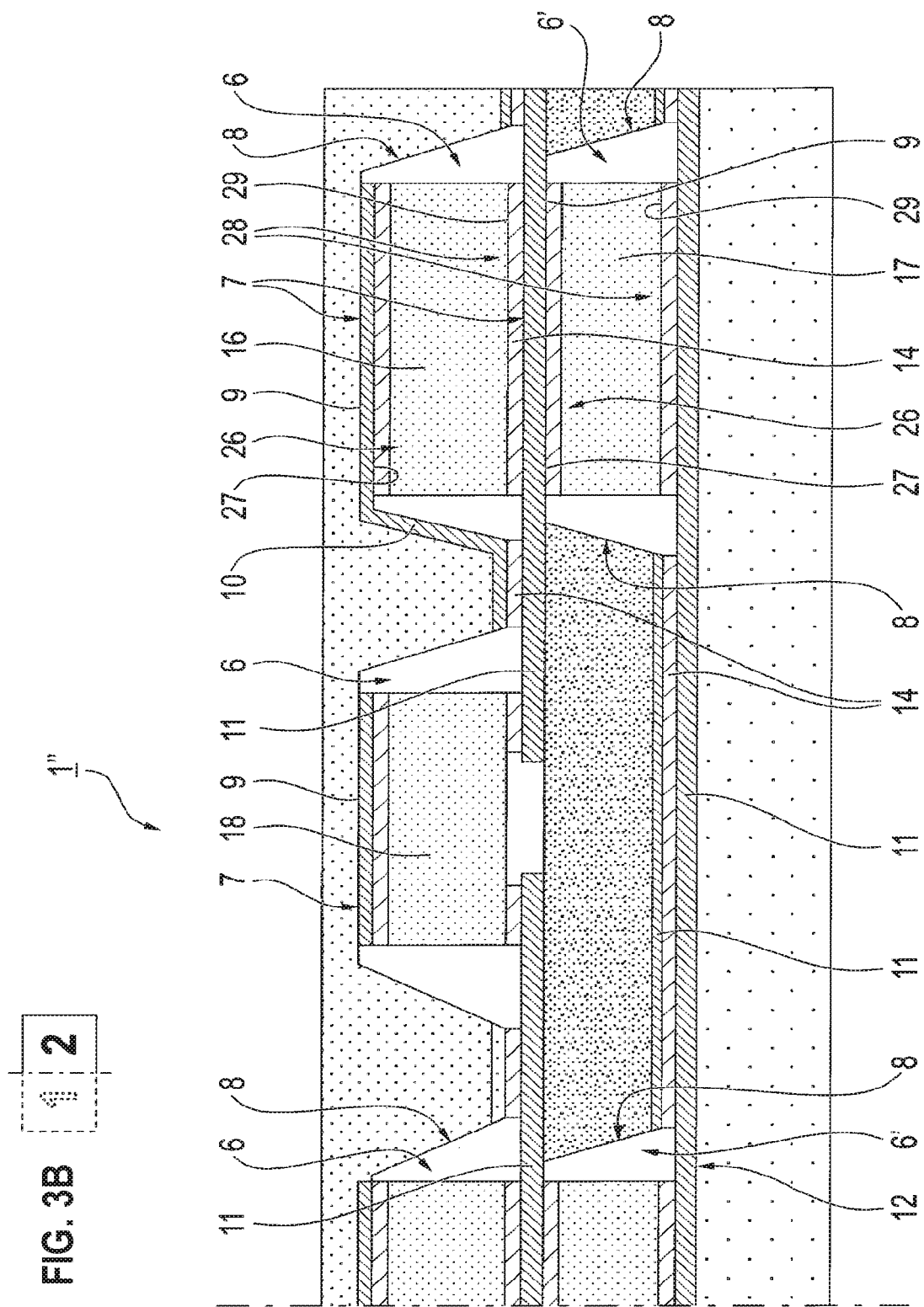

FIG. 3 shows in a third embodiment a semiconductor package 1", where the first substrate 2 and the second substrate 3 are similar to each other and do both comprise cavities 6, 6'. At the bottom wall 7 of the cavities 6, 6' of the first substrate 2 a membrane of the substrate material remains. The cavities 6, 6' within the second substrate 3 are fabricated without remaining substrate substance at the bottom wall 7. The bottom walls 7 of the cavities 6, 6' of the second substrate 3 are constituted by a remaining metallization or conductive area 11. The semiconductor elements 16 and 17 are stacked within the cavities 6, 6' on top of each other. The respective contacts 27, 29 of the semiconductor elements 17, 18 are directly electrically conducted through interposed conductive areas 11. The second substrate 3 and the third substrate 4 both extend with a contact region 20 beyond the first substrate 2. On the contact region 20 of the second substrate 3 and the third substrate 4 freely accessible conductive regions 21 are provided.

Figure 4:
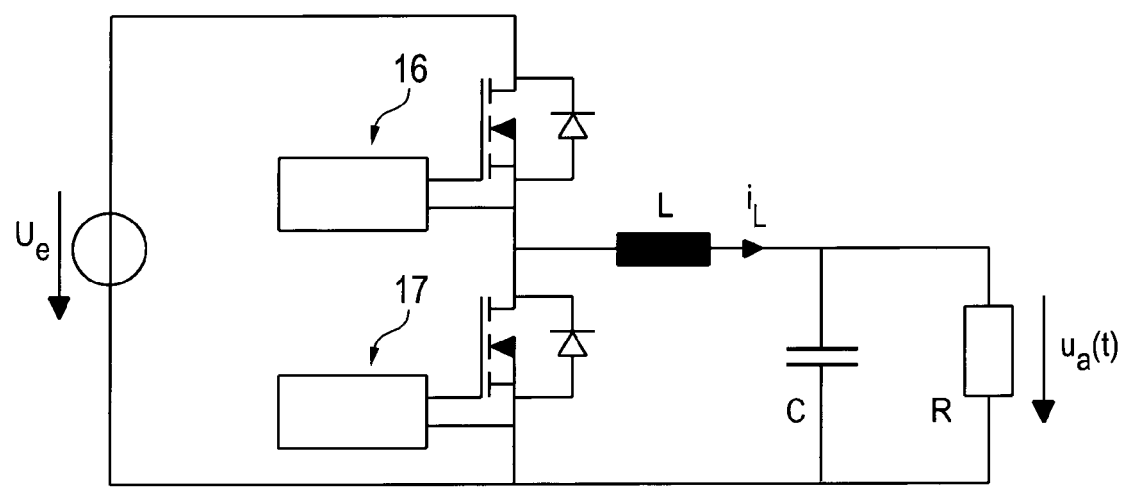

FIG. 4 depicts an electronic circuitry which comprises a half-bridge in a DC voltage link. The half-bridge comprises a first semiconductor element 16 and a second semiconductor element 17. The semiconductor elements 16 and 17 both comprise a switching element, for example, a MOSFET or an IGBT. The switching elements are bridged by a freewheeling diode, respectively. The drawn boxes stand for control modules which control the switching elements.

The shown half-bridge is typically used in electronics, for example, to convert a DC voltage into a AC voltage by pulse width modulation (PWM). The AC output voltage is used, for example, as one phase of an electric machine R, like an electric motor. Additional inductors L and capacitors C may be also provided.

The semiconductor elements 16 comprising at least the switching elements and its respective bridging diodes may be fabricated as a semiconductor die. Preferably, the switching elements or the respective semiconductor elements 16, 17 are stacked one on top of the other in the cavities 6, 6' of a semiconductor package according to one of the FIGS. 1 to 3. The circuitry shown in FIG. 4 including also the passive electric components is preferably realized as a semiconductor package according to the invention.

REFERENCE NUMERALS

1 Semiconductor package
2 First substrate
3 Second Substrate
4 Third substrate
5 Cavity side
5' Front cavity side
6, 6' Cavity
7 Bottom wall
8 Side walls
9 Electric contact surface
10 Conductive path
11 Electrical conductive areas
12 First connection side
13 Second connection side
14 Solder
16 First semiconductor element
17 Second semiconductor element
18 Passive electric component
19 Vias
20 Contact region
21 Electrically conductive region
22 Back cavity side
26 First side
27 First electric contact
28 Second side
29 Second electric contact

The invention claimed is:

1. A semiconductor package, the package comprising:
a first substrate comprising, at a front cavity side, a plurality of cavities, each of the cavities having a bottom wall and side walls, and having a conductive path forming an electric contact surface located at the inner side of the bottom wall of the cavity,
a plurality of semiconductor elements, each of the semiconductor elements comprising a first electric contact surface on a first side and a second electric contact surface on a second side opposite to the first side, wherein at least one of the semiconductor elements is placed within a corresponding cavity at the front cavity side of the first substrate, wherein the first electric contact of the semiconductor element and the electric contact surface at the inner side of the bottom wall of the corresponding cavity are electrically conductive bonded in a material-locking manner,
a second substrate, the second substrate being attached with a connection side to the front cavity side of the first substrate, thereby encapsulating the semiconductor elements located within the corresponding cavities at the front cavity side of the first substrate, and
a third substrate, the third substrate being attached with a connection side to the first substrate or to the second substrate,
wherein the second substrate comprises two opposed connection sides, wherein the third substrate further comprises, on a cavity side which is the connection side, a plurality of cavities, each of the cavities having a bottom wall, side walls, and a conductive path forming an electric contact surface located at the inner side of the bottom wall of the cavity, wherein at least one of the plurality of semiconductor elements is placed within a corresponding cavity at the cavity side of the third substrate, wherein the first electric contact of the semiconductor element and the electric contact surface at the inner side of the bottom wall of the corresponding cavity are electrically conductive bonded in a material-locking manner, and
wherein the third substrate is attached with the cavity side to a connection side of the second substrate, thereby encapsulating the semiconductor elements located within the corresponding cavities at the cavity side of the third substrate.

2. The semiconductor package of claim 1, wherein at least one portion of the conductive path of at least one of the cavities is attached to the inner side of at least one of the side walls of said at least one cavity.

3. The semiconductor package of claim 1, further comprising, at a cavity side of at least one of the substrates, disjunct electrically conductive areas, wherein the conductive path of at least one of the cavities of said cavity side extends between (i) the corresponding electric contact surface located at the inner side of the bottom wall of said at least one cavity and (ii) at least one of the disjunct conductive areas at said cavity side.

4. The semiconductor package of claim 3, wherein at least one of the substrates is extending with a contact region beyond another substrate, the contact region comprising at least one electrically conductive region which is electrically conductive connected with at least one of the electrically conductive areas.

5. The semiconductor package of claim 1, further comprising, at a connection side of at least one of the substrates, disjunct electrically conductive areas, wherein the second electric contact at the second side of at least one of the semiconductor elements and at least one of the conductive areas at the connection side of said at least one substrate are electrically conductive bonded in a material-locking manner.

6. The semiconductor package of claim 5, wherein at least one of the disjunct electrically conductive areas at the cavity side of at least one of the substrates and at least one of the disjunct electrically conductive areas at the connection side of another substrate are electrically conductive bonded in a material-locking manner.

7. The semiconductor package of claim 1, wherein at least one first cavity with a first semiconductor element placed therein and at least one second cavity with a second semiconductor element placed therein are located on top of each other, and wherein at least one electric contact of the first semiconductor element and at least one electric contact of the second semiconductor element are electrically conductive bonded to each other in a material-locking manner.

8. The semiconductor package of claim 7, wherein the electrically conductive bonded electric contacts of the first semiconductor element and of the second semiconductor element are bonded to each other through vias located in one of the substrates or through at least one of the disjunct electrically conductive areas.

9. A semiconductor package, the package comprising:
a first substrate comprising, at a front cavity side, a plurality of cavities, each of the cavities having a bottom wall and side walls, and having a conductive path forming an electric contact surface located at the inner side of the bottom wall of the cavity,
a plurality of semiconductor elements, each of the semiconductor elements comprising a first electric contact surface on a first side and a second electric contact surface on a second side opposite to the first side, wherein at least one of the semiconductor elements is placed within a corresponding cavity at the front cavity side of the first substrate, wherein the first electric contact of the semiconductor element and the electric contact surface at the inner side of the bottom wall of the corresponding cavity are electrically conductive bonded in a material-locking manner,
a second substrate, the second substrate being attached with a connection side to the front cavity side of the first substrate, thereby encapsulating the semiconductor elements located within the corresponding cavities at the front cavity side of the first substrate, and
a third substrate, the third substrate being attached with a connection side to the first substrate or to the second substrate,
wherein the first substrate further comprises, on a back cavity side opposite to the front cavity side, a plurality of cavities, each of the cavities having a bottom wall, side walls, and a conductive path forming an electric contact surface located at the inner side of the bottom wall of the cavity,
wherein at least one of the plurality of semiconductor elements is placed within a corresponding cavity at the back cavity side of the first substrate, wherein the first electric contact of the semiconductor element and the electric contact surface at the inner side of the bottom wall of the corresponding cavity are electrically conductive bonded in a material-locking manner, and
wherein the third substrate is attached with the connection side to the back cavity side of the first substrate, thereby encapsulating the semiconductor elements located within the corresponding cavities at the back cavity side of the first substrate.

10. The semiconductor package of claim 9, wherein at least one portion of the conductive path of at least one of the cavities is attached to the inner side of at least one of the side walls of said at least one cavity.

11. The semiconductor package of claim 9, further comprising, at a cavity side of at least one of the substrates, disjunct electrically conductive areas, wherein the conductive path of at least one of the cavities of said cavity side extends between (i) the corresponding electric contact surface located at the inner side of the bottom wall of said at least one cavity and (ii) at least one of the disjunct conductive areas at said cavity side.

12. The semiconductor package of claim 11, wherein at least one of the substrates is extending with a contact region beyond another substrate, the contact region comprising at least one electrically conductive region which is electrically conductive connected with at least one of the electrically conductive areas.

13. The semiconductor package of claim 9, further comprising, at a connection side of at least one of the substrates, disjunct electrically conductive areas, wherein the second electric contact at the second side of at least one of the semiconductor elements and at least one of the conductive areas at the connection side of said at least one substrate are electrically conductive bonded in a material-locking manner.

14. The semiconductor package of claim 13, wherein at least one of the disjunct electrically conductive areas at the cavity side of at least one of the substrates and at least one of the disjunct electrically conductive areas at the connection side of another substrate are electrically conductive bonded in a material-locking manner.

15. The semiconductor package of claim 9, wherein at least one first cavity with a first semiconductor element placed therein and at least one second cavity with a second semiconductor element placed therein are located on top of each other, and wherein at least one electric contact of the first semiconductor element and at least one electric contact of the second semiconductor element are electrically conductive bonded to each other in a material-locking manner.

16. The semiconductor package of claim 15, wherein the electrically conductive bonded electric contacts of the first semiconductor element and of the second semiconductor element are bonded to each other through vias located in one of the substrates or through at least one of the disjunct electrically conductive areas.

17. A semiconductor package, the package comprising:
a first substrate comprising, at a front cavity side, a plurality of cavities, each of the cavities having a bottom wall and side walls, and having a conductive path forming an electric contact surface located at the inner side of the bottom wall of the cavity, a plurality of semiconductor elements, each of the semiconductor elements comprising a first electric contact surface on a first side and a second electric contact surface on a second side opposite to the first side, wherein at least one of the semiconductor elements is placed within a corresponding cavity at the front cavity side of the first substrate, wherein the first electric contact of the semiconductor element and the electric contact surface at the inner side of the bottom wall of the corresponding cavity are electrically conductive bonded in a material-locking manner, a second substrate, the second substrate being attached with a connection side to the front cavity side of the first substrate, thereby encapsulating the semiconductor elements located within the corresponding cavities at the front cavity side of the first substrate, and a third substrate, the third substrate being attached with a connection side to the first substrate or to the second substrate, wherein the second substrate further comprises, on a cavity side, a plurality of cavities, each of the cavities having a bottom wall, side walls, and a conductive path forming an electric contact surface located at the inner side of the bottom wall of the cavity, wherein at least one of the plurality of semiconductor elements is placed within a corresponding cavity at the cavity side of the second substrate, wherein the first electric contact of the semiconductor element and the electric contact surface at the inner side of the bottom wall of the corresponding cavity are electrically conductive bonded in a material-locking manner, and wherein the third substrate is attached with the connection side to the cavity side of the second substrate, thereby encapsulating the semiconductor elements located within the corresponding cavities at the cavity side of the first substrate.

18. The semiconductor package of claim 17, wherein at least one portion of the conductive path of at least one of the cavities is attached to the inner side of at least one of the side walls of said at least one cavity.

19. The semiconductor package of claim 17, further comprising, at a cavity side of at least one of the substrates, disjunct electrically conductive areas, wherein the conductive path of at least one of the cavities of said cavity side extends between (i) the corresponding electric contact surface located at the inner side of the bottom wall of said at least one cavity and (ii) at least one of the disjunct conductive areas at said cavity side.

20. The semiconductor package of claim 19, wherein at least one of the substrates is extending with a contact region beyond another substrate, the contact region comprising at least one electrically conductive region which is electrically conductive connected with at least one of the electrically conductive areas.

21. The semiconductor package of claim 17, further comprising, at a connection side of at least one of the substrates, disjunct electrically conductive areas, wherein the second electric contact at the second side of at least one of the semiconductor elements and at least one of the conductive areas at the connection side of said at least one substrate are electrically conductive bonded in a material-locking manner.

22. The semiconductor package of claim 21, wherein at least one of the disjunct electrically conductive areas at the cavity side of at least one of the substrates and at least one of the disjunct electrically conductive areas at the connection side of another substrate are electrically conductive bonded in a material-locking manner.

23. The semiconductor package of claim 17, wherein at least one first cavity with a first semiconductor element placed therein and at least one second cavity with a second semiconductor element placed therein are located on top of each other, and wherein at least one electric contact of the first semiconductor element and at least one electric contact of the second semiconductor element are electrically conductive bonded to each other in a material-locking manner.

24. The semiconductor package of claim 23, wherein the electrically conductive bonded electric contacts of the first semiconductor element and of the second semiconductor element are bonded to each other through vias located in one of the substrates or through at least one of the disjunct electrically conductive areas.

* * * * *